(12) United States Patent
Zhou et al.

(10) Patent No.: US 11,698,182 B2
(45) Date of Patent: Jul. 11, 2023

(54) LIGHT SOURCE MODULE AND LIGHTING DEVICE COMPRISING SAME

(71) Applicants: SUZHOU OPPLE LIGHTING CO., LTD., Suzhou (CN); OPPLE LIGHTING CO., LTD., Shanghai (CN)

(72) Inventors: Zhixian Zhou, Suzhou (CN); Jie Qiang, Suzhou (CN)

(73) Assignees: Suzhou Opple Lighting Co., Ltd., Suzhou (CN); Opple Lighting Co., Ltd., Shanghai (CN)

( * ) Notice: Subject to any disclaimer, the term of this patent is extended or adjusted under 35 U.S.C. 154(b) by 29 days.

(21) Appl. No.: 17/543,021

(22) Filed: Dec. 6, 2021

(65) Prior Publication Data

US 2022/0090761 A1  Mar. 24, 2022

Related U.S. Application Data

(63) Continuation of application No. PCT/CN2020/093967, filed on Jun. 2, 2020.

(51) Int. Cl.
| | |
|---|---|
| *H01L 33/50* | (2010.01) |
| *F21V 9/32* | (2018.01) |
| *F21K 9/64* | (2016.01) |

(52) U.S. Cl.
CPC .................. *F21V 9/32* (2018.02); *F21K 9/64* (2016.08); *H01L 33/50* (2013.01)

(58) Field of Classification Search
CPC ...... H01L 33/502; H01L 33/504; Y02B 20/30
See application file for complete search history.

(56) References Cited

U.S. PATENT DOCUMENTS

| | | | |
|---|---|---|---|
| 9,491,831 B2 | 11/2016 | Chen et al. | |
| 10,312,419 B2 | 6/2019 | Oh et al. | |
| 2013/0082289 A1* | 4/2013 | Sakuta | H01L 33/08 |
| | | | 257/89 |

(Continued)

FOREIGN PATENT DOCUMENTS

| | | |
|---|---|---|
| CN | 105609494 A | 5/2016 |
| CN | 108598244 A | 9/2018 |

(Continued)

OTHER PUBLICATIONS

International Search Report of PCT Application No. PCT/CN2020/093967 dated Aug. 26, 2020 with English translation, (4p).

*Primary Examiner* — Andrew J Coughlin
(74) *Attorney, Agent, or Firm* — Arch & Lake LLP

(57) ABSTRACT

A light source module and a lighting device using the light source module. The light source module includes a first light-emitting element and a packaging part covering the first light-emitting element. The packaging part includes a first additional luminous body, a second additional luminous body, and a third additional luminous body, the light emitted by each luminous body is mixed into day white light, which is used as the emitted light of the light source module. The light source module provided by the present disclosure provides a cold white LED (5700K) light source with high luminous efficiency, high CS values and high color rendering by controlling the ratio of luminous energy of different wavelength ranges in the total luminous energy.

20 Claims, 7 Drawing Sheets

(56) References Cited

U.S. PATENT DOCUMENTS

| | | | | |
|---|---|---|---|---|
| 2015/0049459 A1* | 2/2015 | Peeters | ............... | F21K 9/60 |
| | | | | 362/231 |
| 2016/0030609 A1* | 2/2016 | Peterson | ............ | A61L 2/084 |
| | | | | 362/231 |
| 2016/0030610 A1* | 2/2016 | Peterson | ............ | A61L 2/084 |
| | | | | 362/231 |
| 2016/0120003 A1* | 4/2016 | Chen | ................. | H05B 33/12 |
| | | | | 313/503 |
| 2017/0250321 A1* | 8/2017 | Fujio | ................ | H01L 33/501 |
| 2017/0345976 A1* | 11/2017 | Asai | ................. | H01L 33/507 |
| 2018/0323350 A1* | 11/2018 | Oh | ................... | H01L 33/504 |
| 2021/0043809 A1* | 2/2021 | Katou | ............. | H01L 33/505 |

FOREIGN PATENT DOCUMENTS

| | | |
|---|---|---|
| CN | 108799849 A | 11/2018 |
| CN | 108922955 A | 11/2018 |
| CN | 110212076 A | 9/2019 |
| CN | 209963086 U | 1/2020 |

\* cited by examiner

LIGHT SOURCE MODULE AND LIGHTING DEVICE COMPRISING SAME

CROSS-REFERENCE TO RELATED APPLICATIONS

This application is based upon and claims the priority of PCT patent application No. PCT/CN2020/093967 filed on Jun. 2, 2020 which claims priority to the Chinese patent application No. 201910486921.6 filed on Jun. 6, 2019, the entire contents of which are hereby incorporated by reference herein for all purposes.

TECHNICAL FIELD

The present disclosure relates to a light source module and a lighting device comprising the light source module.

BACKGROUND

With the arrival and development of the third lighting technology revolution, incandescent lamps and halogen lamps and the like have been gradually banned from production and sales all over the world due to low luminous efficiency and non-energy saving, and light-emitting diode (LED) lighting appliances have been widely used instead.

SUMMARY

The present disclosure is to provide a light source module and a lighting device.

According to a first aspect, a light source module is provided. The light source module may include a first light-emitting element and a packaging part covering the first light-emitting element. The first light-emitting element emits first color light with a peak wavelength of 435~465 nm; the packaging part may include: a first additional luminous body which is arranged to receive part of the light emitted by the first light-emitting element and convert it into second color light with a peak wavelength of 485~515 nm; the second additional luminous body which is arranged to receive part of the light emitted by the first light-emitting element and convert it into third color light with a peak wavelength of 520~580 nm; the third additional luminous body which is arranged to receive part of the light emitted by the first light-emitting element and convert it into fourth color light with a peak wavelength of 615~655 nm, the first color light, the second color light, the third color light and the fourth color light are mixed to form emitted light of the light source module, and the emitted light is neutral white light, that is, on a CIE1931 color space, the emitted light is located in an interval enclosed by points with relevant color temperature of 5750±400K and distances from the black body trajectory duv=−0.006~0.006. The spectrum of the emitted light has following features: defining a spectrum of the emitted light is in a visible light range, that is, a wavelength range [380~780 nm], as an entire spectral energy of the emitted light; a spectral energy in the wavelength range [380~470 nm] accounts for 12.0%~32.0% of the entire spectral energy; a spectral energy in the wavelength range (470~560 nm] accounts for 25.0%~45.0% of the entire spectral energy; a spectral energy in the wavelength range (560~780 nm] accounts for 36.0%~56.0% of the entire spectral energy; a spectral energy in the wavelength range (470~520 nm] accounts for 14.0%~34.0% of the entire spectral energy.

According to a second aspect, the present disclosure further provides a lighting device. The lighting device may include a light source module described above.

It is to be understood that both the foregoing general description and the following detailed description are exemplary and explanatory only and are not restrictive of the present disclosure.

DETAILED DESCRIPTION

A light source module and a lighting device proposed by the present disclosure are described in further detail below in combination with accompanying drawings and some examples in accordance with the present disclosure.

Some LED lighting products may mainly solve the problems of energy saving, illumination, color and color rendering. In the case of using the LED lighting products, more and more people are concerned that lighting may affect the physiological rhythm of human body. For the impact of lighting products on human physiological rhythm, we can evaluate it through the circadian stimulus evaluation model, that is, the CS value in the industry, the spectrum with high CS value is especially suitable for people to concentrate on study and work under the same illumination. Sometimes, the lamps used in office buildings usually only consider the indicators such as color temperature and illumination, and there is no LED lighting product that can improve students' concentration by increasing the CS value, and can take into account energy saving, illumination, color and color rendering.

Figure 1:
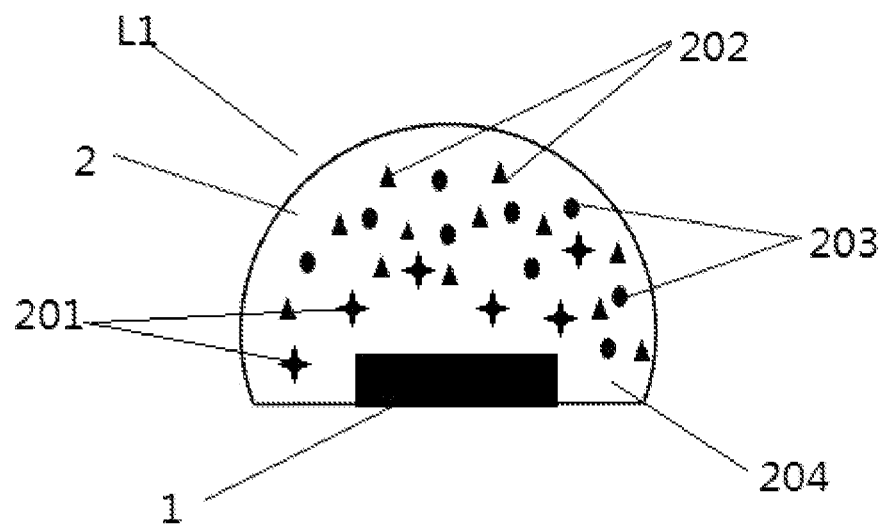
FIG. 1 is a structural diagram of a light source module according to an example of the present disclosure.
Figure 12:
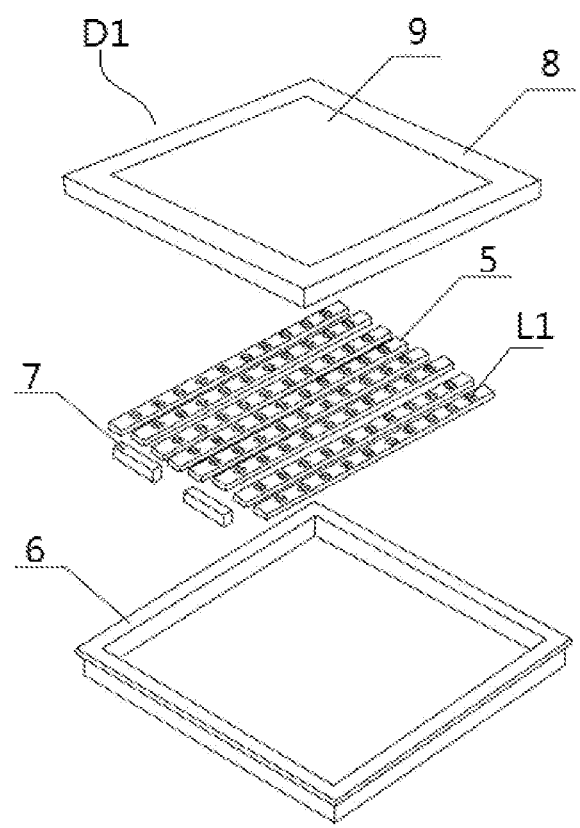
FIG. 12 is a structural diagram of a lamp according to an example of the present disclosure.

As shown in FIG. 1, the light source module L1 in an example provided by the present disclosure is a light source product, which can be applied to a lighting device D1 as shown in FIG. 12 to provide classroom lighting. The lighting device D1 is a lamp panel, which may also be a chandelier, a ceiling lamp, etc. in other examples, or the light source module L1 may also be applied to various lamps such as table lamp, down light, spotlight, etc. The lighting device D1 comprises a chassis 6, a face frame 8 provided with a diffusion plate 9, a light source module L1 arranged on the light source plate 5 and a power supply module 7 providing power required for the work of the light source module L1. The lighting device D1 may also be provided with a controller, a heat dissipation device, and a light distribution component, etc. according to the functions and requirements of specific lamps. The controller can be used to adjust the light color, light intensity, etc. of the irradiated light emitted by the light source module L1, and the light distribution component may also be a lampshade, a lens, a diffusion element, a light guide, etc. in addition to the diffusion plate in the example.

An example of the light source module L1 of the present disclosure is a light-mixing white light LED packaging chip, which may be an LED chip with a general patch packaging structure or COB packaging structure. As shown in FIG. 1, the light source module L1 comprises at least one first light-emitting element 1 and a packaging part 2 covering the first light-emitting element.

The first light-emitting element 1 is a blue LED chip, which is directly excited by semiconductor materials, its peak wavelength of the light emission is located in the range of 435~465 nm, and the light color is blue. Here, we call the light emitted by the first light-emitting element 1 as the first color light. LED chip comprises formal chip or flip-chip, single LED chip or multiple LED chips are connected together in series, parallel or series parallel.

The packaging part 2 uses transparent silica gel or transparent resin as a base material 204, and the transparent resin refers to one of epoxy resin and urea resin. The base material 204 is doped with a first additional luminous body 201, a second additional luminous body 202 and a third additional luminous body 203. The first additional luminous body 201 is blue-green fluorescent powder that receives part of the light emitted by the first light-emitting element 1 and converts it into the second color light with a peak wavelength of 485~515 nm and a half width of 25~65 nm. The second additional luminous body 202 comprises at least one of yellow fluorescent powder and green fluorescent powder with a peak wavelength of 520~580 nm, a half width of the emission spectrum of 60~115 nm, and an optional half width of 90~115 nm. Because color is an intuitive perception of human body, it is impossible to accurately distinguish the spectral boundaries between yellow and green. In the present application, we call green fluorescent powder with a peak wavelength of 520~540nm and yellow fluorescent powder with a peak wavelength of 540~580 nm. In the present application, the second additional luminous body 202 may adopt one of the yellow fluorescent powder and the green fluorescent powder, as in example 1 hereafter. In other examples, two kinds of green powder may be mixed, as in example 2 and example 4. However, in order to provide better color rendering, the second additional luminous body in examples 3, 5, 6, 7 and 8 adopts the scheme of yellow fluorescent powder and green fluorescent powder. That is, the second additional luminous body comprises a combination of the yellow fluorescent powder and the green fluorescent powder. The combined fluorescent powder receives part of the light emitted by the first light-emitting element 1 and converts it into the third color light with a peak wavelength of 520~580 nm. The third additional luminous body 203 is the red fluorescent powder or orange fluorescent powder that receives part of the light emitted by the first light-emitting element 1 and converts it into the fourth color light with a peak wavelength of 615~655 nm and a half width of 80~120 nm, and the optional half width is 80~100 nm. The packaging part 2 may also comprise a light diffuser, the light diffuser may be one of nano titanium oxide, nano alumina and nano silicon oxide. The above various fluorescent powder and light diffuser are weighed at the ratio and mixed into the base material 204, and then fully and evenly stirred in a mixer to make the fluorescent powder and light diffuser evenly distributed in the base material 204. After removing bubbles, the base material 204 mixed with fluorescent powder is covered over the blue LED chip as the first light-emitting element 1 by a dispensing machine to form the packaging part 2.

Hereafter, we will illustrate the various fluorescent powder we use. For convenience of description, we define the sum of the weight of the first additional luminous body, the second additional luminous body and the third additional luminous body as the total fluorescent powder weight. The ratio of the total fluorescent powder weight in the packaging part 2 is 20~45%. The weight of the packaging part 2 is the total weight of the base material 204 mixed with the fluorescent powder and light diffuser.

The blue-green fluorescent powder as the first additional luminous body 201 accounts for 20.0~55.0% of the total fluorescent powder weight, which may be selected from any one of the following fluorescent powder or may be formed by mixing two or more of the following fluorescent powder. The specific types of fluorescent powder are as follows (in the present disclosure, the molar ratio is represented by x): (a) nitrogen oxide with $Eu^{2+}$ as an activator and the general chemical composition formula: $(Ba,Ca)_{1-x}Si_2N_2O_2:Eu_x$, where x=0.005~0.200; (b) Ga doped garnet fluorescent powder with $Eu^{2+}$ as an activator and the general chemical composition formula: Ga—LuAG:Eu; and (c) silicate fluorescent powder with $Eu^{2+}$ as an activator and the general chemical composition formula: $Ba_2SiO_4$:Eu.

In this example, the combination of yellow fluorescent powder and green fluorescent powder as the second additional luminous body 202 accounts for 22.0~52.0% of the total fluorescent powder weight. As mentioned above, there is no obvious boundary between yellow and green. Similarly, the yellow fluorescent powder and the green fluorescent powder do not have a clear boundary, they basically have the same chemical general formula, and the difference is only that the molar ratios of components are different. Except for example 1, examples 2-8 of the present application adopt two kinds of fluorescent powder with different peak wavelengths in the 520~580 nm band for combination. Further, in the examples 3, 5, 6, 7 and 8, the two kinds of fluorescent powder adopt different light colors, one of which is yellow fluorescent powder, we define that its peak wavelength is greater than 540 nm, and the other is green fluorescent powder, and its peak wavelength is less than 540 nm. In this example, two kinds of yellow fluorescent powder and green fluorescent powder with different peak wavelengths are selected for combination, mainly to improve display performance and make the entire spectrum smoother. In other examples, only one kind of yellow fluorescent powder or green fluorescent powder is selected to achieve the same CS value, but the display performance may be slightly worse than that in this example. The specific yellow fluorescent powder/green fluorescent powder may be formed by mixing any one or more of the following fluorescent powder: (a) garnet structure fluorescent powder with $Ce^{3+}$ as an activator and the general chemical composition formula: $(M4)_{3-x}(M5)_5O_{12}:Ce_x$, where M4 is at least one element of Y, Lu, Gd and La, M5 is at least one element of Al and Ga, x=0.005~0.200; (b) silicate system phosphor with $Eu^{2+}$ as an activator and the general chemical composition formula: $(M6)_{2-x}SiO_4:Eu_x$, or $(Ba,Ca,Sr)_{2-x}(Mg,Zn)Si_2O_7:Eu_x$, where M6 is at least one element of Mg, Sr, Ca and Ba, x=0.01~0.20; (c) nitrogen oxide fluorescent powder (Cylon β-SiAlON) with $Eu^{2+}$ as an activator, and the general chemical composition formula: $Si_bAl_cO_dN_e:Eu_x$, where x =0.005~0.400, b+c=12, d+e=16; and (d) aluminate system fluorescent powder with $Eu^{2+}$ as an activator and the general chemical composition formula: $(Sr,Ba)_{2-x}Al_2O_4:Eu_x$, or $(Sr,Ba)_{4-x}Al_{14}O_{25}:Eu_x$, where x=0.01~0.15.

The red fluorescent powder or the orange fluorescent powder as the third additional luminous body 203 accounts for 7.0~36.0% of the total fluorescent powder weight, which may be selected from any one of the following fluorescent powder, or may be formed by mixing two or more of the following fluorescent powder. The specific kinds of fluorescent powder are as follows (in the present disclosure, the molar ratio is represented by x): (a) nitride red powder in a 1113 crystal structure with $Eu^{2+}$ as an activator and the general chemical composition formula: $(M1)_{1-x}AlSiN_3:Eu_x$, where M1 is at least one element of Ca, Sr and Ba, x=0.005~0.300; (b) nitride red powder in a 258 crystal structure with $Eu^{2+}$ as an activator and the general chemical composition formula: $(M2)_{2-x}Si_5N_8:Eu_x$, where M2 is at least one element of Ca, Sr, Ba and Mg, x=0.005~0.300; (c) nitrogen oxide fluorescent powder (Cylon α-SiALON) with $Eu^{2+}$ as an activator and the general chemical composition formula: $((M3)_{1-a})_xSi_bAl_cO_dN_e:Eu_a$, where M3 is at least one element of Li, Na, K, Rb, Cs, Sr, Ba, Sc, Y, La and Gd, x=0.15~1.5, a=0.005~0.300, b+c=12, d+e=16; and (d) silicate fluorescent powder with $Eu^{2+}$ as an activator and the general chemical composition formula: $(Sr,Ba)_{3-x}Si_5O_5:Eu_x$, where x=0.005~0.300.

The above shows the types of the fluorescent powder that may be selected. In the present application, we provide 8 examples. In these examples, a total of 9 kinds of fluorescent powder are selected. The parameters and chemical formulas of each fluorescent powder selected in the examples are shown in the table below. For ease of description, we have defined a code for the fluorescent powder in Table 1, we will describe the fluorescent powder with the code in the subsequent example descriptions, and the peak value and chemical formula of the fluorescent powder will not be described in detail in each example.

| No | Color | Code | x | y | Peak (nm) | Hw (nm) | Chemical formula |
|---|---|---|---|---|---|---|---|
| 1 | red fluorescent powder | R650 | 0.6692 | 0.3305 | 647.9 | 86.6 | $Ca_{1-x}AlSiN_3:Eu_x$ (x = 0.01~0.10) |
| 2 | red fluorescent powder | R640 | 0.6453 | 0.3540 | 639.2 | 95.1 | |
| 3 | red fluorescent powder | R630 | 0.6377 | 0.3617 | 627.8 | 94.2 | |
| 4 | yellow fluorescent powder | Y550 | 0.4165 | 0.5423 | 545.5 | 115.8 | $(Y,Gd)_{3-x}(Ga,Al)_5O_{12}:Ce_x$ (x = 0.008~0.10) |
| 5 | yellow fluorescent powder | Y565 | 0.4546 | 0.5161 | 560.7 | 121.7 | |
| 6 | green fluorescent powder 1 | G-Ga535 | 0.3564 | 0.5679 | 529.3 | 106.2 | $Y_{3-x}(Ga,Al)_5O_{12}:Ce_x$ (x = 0.01~0.10) |
| 7 | green fluorescent powder 2 | G-L535 | 0.3780 | 0.5658 | 538.5 | 107.6 | $(Lu,Gd,La)_{3-x}Al_5O_{12}:Ce_x$ (x = 0.005~0.15) |
| 8 | blue-green fluorescent powder 1 | BG490 | 0.0761 | 0.4539 | 495.4 | 31.6 | $Ba_{1-x}Si_2N_2O_2:Eu_x$ (x = 0.008~0.18) |
| 9 | blue-green fluorescent powder 2 | BG500 | 0.0645 | 0.4675 | 500.0 | 38.1 | $(Lu,Gd,La)_{3-x}Al_5O_{12}:Ce_x$ (x = 0.005~0.15) |

The parameters in the above table are for this kind of fluorescent powder, x and y represent the coordinate value of the light color of the fluorescent powder on the CIE1931 color space, Peak represents the peak wavelength, and Hw represents the half width. The above values are the actual values of the fluorescent powder used in the examples and are not a limitation of the present disclosure. Because in actual production, due to the difference in purity and particle size of the fluorescent powder, the peak wavelength and half width of the fluorescent powder may be deviated slightly from the above data, and this deviation value will generally be controlled within ±5 nm. It should be considered that other schemes within this range are equivalent to the above fluorescent powder.

Table 2 shows the eight examples of the present application, and the types of fluorescent powder and the weight of various types of fluorescent powder used in each example. The ratio of each additional luminous body refers to the ratio of the weight of multiple fluorescent powder in each additional luminous body in the total fluorescent powder weight, respectively. The ratio of total fluorescent powder refers to the ratio of the total fluorescent powder weight, which refers to the weight of all fluorescent powder comprised in the three additional luminous body, in the total weight of the packaging part 2 after all the fluorescent powder are mixed with the base material 204. In these examples, the base material 204 is transparent silica gel with a weight of 10 g.

TABLE 2

|  | The first additional luminous body | | | The second additional luminous body | | | The third additional luminous body | | | The total fluorescent powder ratio |
|---|---|---|---|---|---|---|---|---|---|---|
|  | Code | Weight (g) | Ratio | Code | Weight (g) | Ratio | Code | Weight (g) | Ratio |  |
| Example 1 | BG500 | 1.63 | 33.3% | Y565 | 1.95 | 39.9% | R640 | 0.70 | 26.8% | 32.8% |
|  |  |  |  |  |  |  | R630 | 0.61 |  |  |
| Example 2 | BG490 | 1.40 | 27.7% | G-Si525 | 0.90 | 43.5% | R630 | 1.46 | 28.9% | 33.6% |
|  |  |  |  | G-Ga535 | 1.30 |  |  |  |  |  |
| Example 3 | BG490 | 1.35 | 26.2% | Y565 | 1.00 | 45.9% | R630 | 1.44 | 27.9% | 34.0% |
|  |  |  |  | G-Ga535 | 1.37 |  |  |  |  |  |
| Example 4 | BG490 | 1.32 | 29.4% | G-L535 | 0.80 | 43.4% | R630 | 1.22 | 27.2% | 31.0% |
|  |  |  |  | G-Ga535 | 1.15 |  |  |  |  |  |
| Example 5 | BG490 | 1.23 | 30.4% | Y550 | 0.80 | 43.3% | R630 | 1.06 | 26.2% | 28.8% |
|  |  |  |  | G-L535 | 0.95 |  |  |  |  |  |
| Example 6 | BG500 | 1.26 | 26.1% | Y565 | 0.80 | 46.6% | R630 | 1.32 | 27.3% | 32.6% |
|  |  |  |  | G-Ga535 | 1.45 |  |  |  |  |  |
| Example 7 | BG490 | 1.47 | 27.8% | Y565 | 1.00 | 42.8% | R630 | 1.55 | 29.4% | 34.6% |
|  |  |  |  | G-Ga535 | 1.26 |  |  |  |  |  |
| Example 8 | BG490 | 1.40 | 31.7% | Y565 | 0.80 | 42.6% | R630 | 1.13 | 25.6% | 30.6% |
|  |  |  |  | G-Ga535 | 1.08 |  |  |  |  |  |

The weight of the fluorescent powder in the examples in Table 2 is the data used in the case that we make the sample chip of the light source module L1. In fact, in mass production, the weight will vary slightly due to different batches of fluorescent powder, but its basic ratio is in a fixed range. The application of the amount of the various fluorescent powder is mainly to control the energy ratio of the mixed emitted light in the specified wavelength. Because the energy distribution affects the CS value of the emitted light (the specific calculation method of CS value will be described in detail later in the case of introducing the spectrum of the examples), we have a basic requirement for the energy distribution in each range when designing the chip. Here, we only discuss the spectrum in the visible light range, so the entire spectral energy below refers to the total spectral energy in the visible light range, that is, in the wavelength range [380~780 nm]. In the spectrum of emitted light of the chip: the spectral energy in the wavelength range [380~470 nm] accounts for 12.0%~32.0% of the entire spectral energy, and optionally 17.0%~27.0%; the spectral energy in the wavelength range (470~560 nm] accounts for 25.0%~45.0% of the total spectral energy, and optionally 27.0%~37.0%; the spectral energy in the wavelength range (560~780 nm] accounts for 36.0%~56.0% of the total spectral energy, and optionally 40.0%~50.0%. In the previous RGB mixing schemes, the (470~520 nm] range is usually a wavelength valley with little energy, but in the present application, we pay special attention to this range and increase the CS value by increasing the energy in this range. Therefore, the spectral energy in this range is required to account for 14.0%~34.0% of the total spectral energy, and optionally 18.0%~28.0%.

In the case that the energy division in each spectral range is basically determined, the fluorescent powder we use is also deployed based on this goal. The energy in the wavelength range [380~470 nm] is provided by the blue LED chip of the first light-emitting element 1, and in fact, all the energy of the emitted light is provided by it. Originally, all the energy should be concentrated in this range, however, because part of the light is converted into other light colors by fluorescent powder, so the converted energy is distributed in other wavelength ranges, and the energy retained in this range is less than 32%. The spectral energy in the wavelength range (470~560 nm] is mainly provided by the first additional luminous body 201 and the second additional luminous body 202 after converting part of the emitted light of the first light-emitting element 1. Here, it is "mainly", because the spectrum is continuous, and the emitted light of the first light-emitting element 1 itself is not completely energy-free in this range, but is relatively small compared to the energy after conversion. In the case of designing the chip, we mainly consider the conversion part of the fluorescent powder, select a more appropriate powder weight ratio, and then actually measure the energy in this range. The measured energy can comprise the energy provided by each luminous body, but it is the first additional luminous body 201 and the second additional luminous body 202 that play a main role in this range. It can be seen from Table 2 that the ratio of the blue-green fluorescent powder as the first additional luminous body 201 in the total fluorescent powder weight is in the range of 26.1% to 33.3%. Considering that other types of fluorescent powder can be used, it is considered that the ratio of the first additional luminous body 201 in the total fluorescent powder weight should be in the range of 20%~55%. The purpose of adding the second additional luminous body 202 in the present application is to increase the energy of the (470~520 nm] range, but the energy of this range should not be too high, otherwise the color of white light will be affected. It can be seen from Table 2 that the fluorescent powder as the second additional luminous body 202 is basically a combination of the yellow fluorescent powder and green fluorescent powder, and its ratio in the total fluorescent powder weight is in the range of 39.9% to 46.6%. In the present application, it is considered that the ratio of the second additional luminous body 202 in the total fluorescent powder weight should be in the range of 22.0~52.0%. The spectral energy in the wavelength range (560~780 nm] is mainly provided by the red fluorescent powder or the orange fluorescent powder as the third additional luminous body 203. In Table 2, the ratio of the third additional luminous body 203 in the total fluorescent powder weight is in the range of 25.6% to 29.4%. It is further considered that the ratio of other fluorescent powder other than the examples can be expanded to the range of 7%~36%. These fluorescent powder may be coated on the LED chip by being mixed into the transparent silica gel, or the remote fluorescent powder may be set far away from the chip, or partially mixed into the packaging glue and partially set on the external surface. The present application is not limited thereto.

The function of each additional luminous body in the light source module 1 is to receive part of the light emitted by the first light-emitting element 1 and convert it into light with other colors different from the first color. In the present example, the emitted light of the light source module L1 is formed after the first color light, the second color light, the third color light and the fourth color light are mixed, and on the CIE1931 color space, the emitted light of the light source module L1 is the white light in the interval enclosed by the points with relevant color temperature 5750±400K and distances from the black body trajectory duv=−0.006~0.006.

Refer to the table above for detailed description of each implementation.

Figure 4:
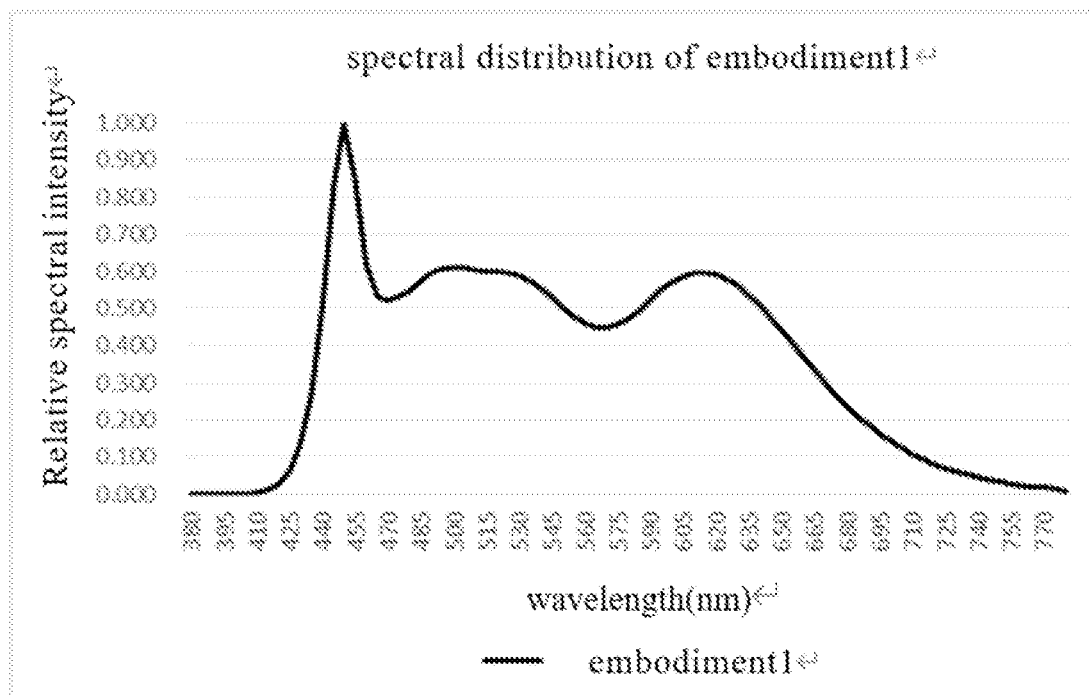
FIG. 4 is a spectrum diagram of emitted light according to example 1 of the present disclosure.

In the example 1, in the light source module L1, the first light-emitting element 1 is a blue LED chip with Peak=450 nm. Weigh and mix 0.70 g of red fluorescent powder with the code of R630 and 0.61 g of red fluorescent powder with the code R630 as the third additional luminous body 203. The second additional luminous body 202 is the yellow fluorescent powder with the code Y565, and the weight of the yellow powder is 1.95 g. Weigh 1.63 g of blue-green fluorescent powder with the code BG500 as the first additional luminous body 201. Put the above fluorescent powder into 10.00 g transparent silica gel, mix it fully and evenly in a mixer, coat it on the blue LED chip, dry and remove bubbles to obtain a cold white LED chip, its spectrum is shown in FIG. 4, and the specific luminous characteristics are shown in Table 3.

Figure 5:
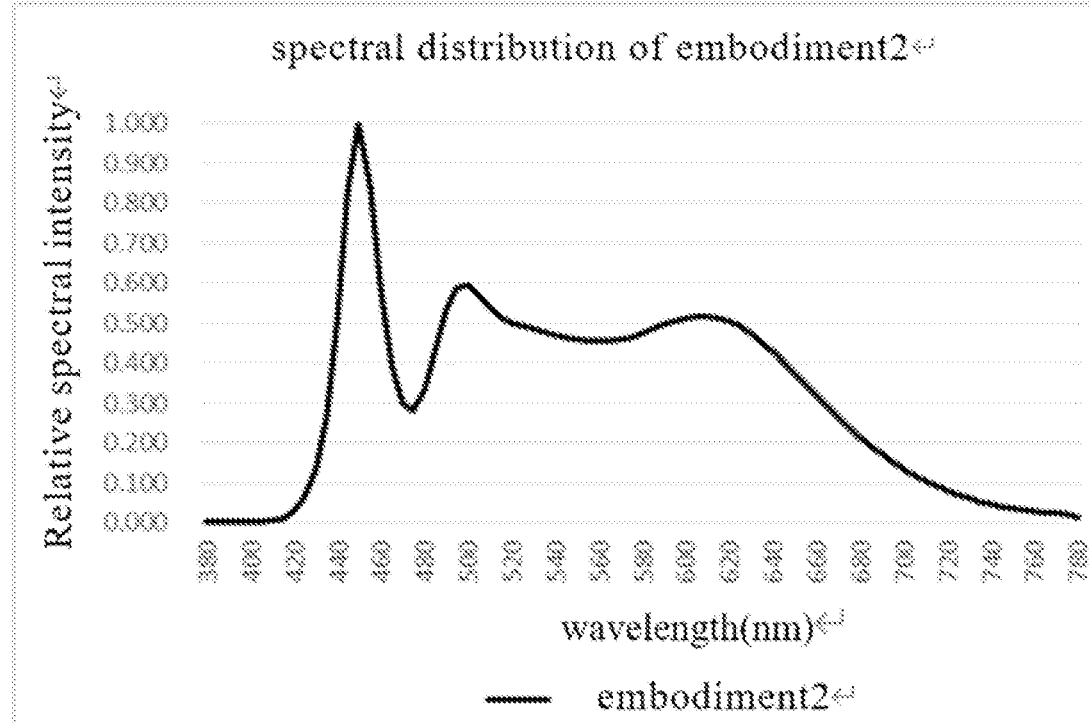
FIG. 5 is a spectrum diagram of emitted light according to example 2 of the present disclosure.

In the example 2, in the light source module L1, the first light-emitting element 1 is a blue LED chip with Peak=450 nm. Weigh 1.46 g of red fluorescent powder with the code R630 as the third additional luminous body 203. The second additional luminous body 202 is composed of 0.90 g of green fluorescent powder with the code G—Si525 and 1.30 g of green fluorescent powder with the code G-Ga535. Weigh 1.40 g of blue-green fluorescent powder with the code BG490 as the first additional luminous body 201. Put the above fluorescent powder and 0.1 g of light diffuser nano titanium oxide into 10.00 g of transparent silica gel, mix it fully and evenly in a mixer, coat it on the blue LED chip, dry and remove bubbles to obtain a cold white LED chip, its spectrum is shown in FIG. 5, and the specific luminous characteristics are shown in Table 3.

Figure 6:
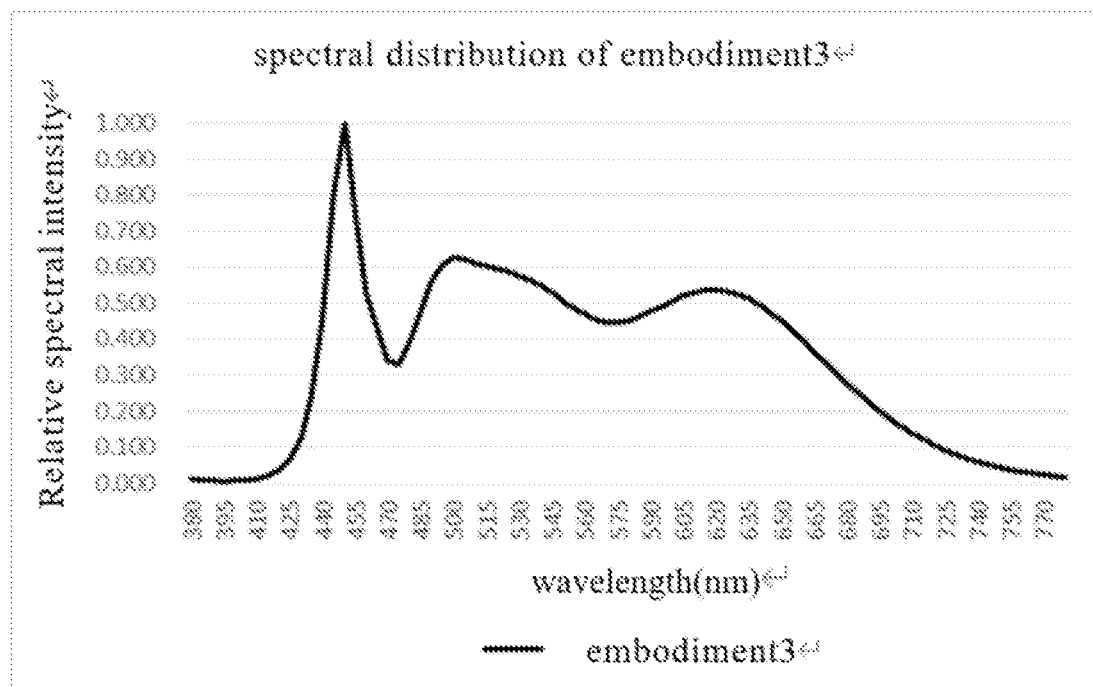
FIG. 6 is a spectrum diagram of emitted light according to example 3 of the present disclosure.

In the example 3, in the light source module L1, the first light-emitting element 1 is a blue LED chip with Peak=450 nm. Weigh 1.44 g of red fluorescent powder with the code R630 as the third additional luminous body 203. The second additional luminous body 202 is composed of yellow fluorescent powder with the code Y565 and green fluorescent powder with the code G-Ga535, where the yellow fluorescent powder is 1.00 g and the green fluorescent powder is 1.37 g. Weigh 1.35 g of blue-green fluorescent powder with the code BG490 as the first additional luminous body 201. Put the above fluorescent powder into 10.00 g of transparent silica gel, mix it fully and evenly in a mixer, coat it on the blue LED chip, dry and remove bubbles to obtain a cold white LED chip, its spectrum is shown in FIG. 6, and the specific luminous characteristics are shown in Table 3.

Figure 7:
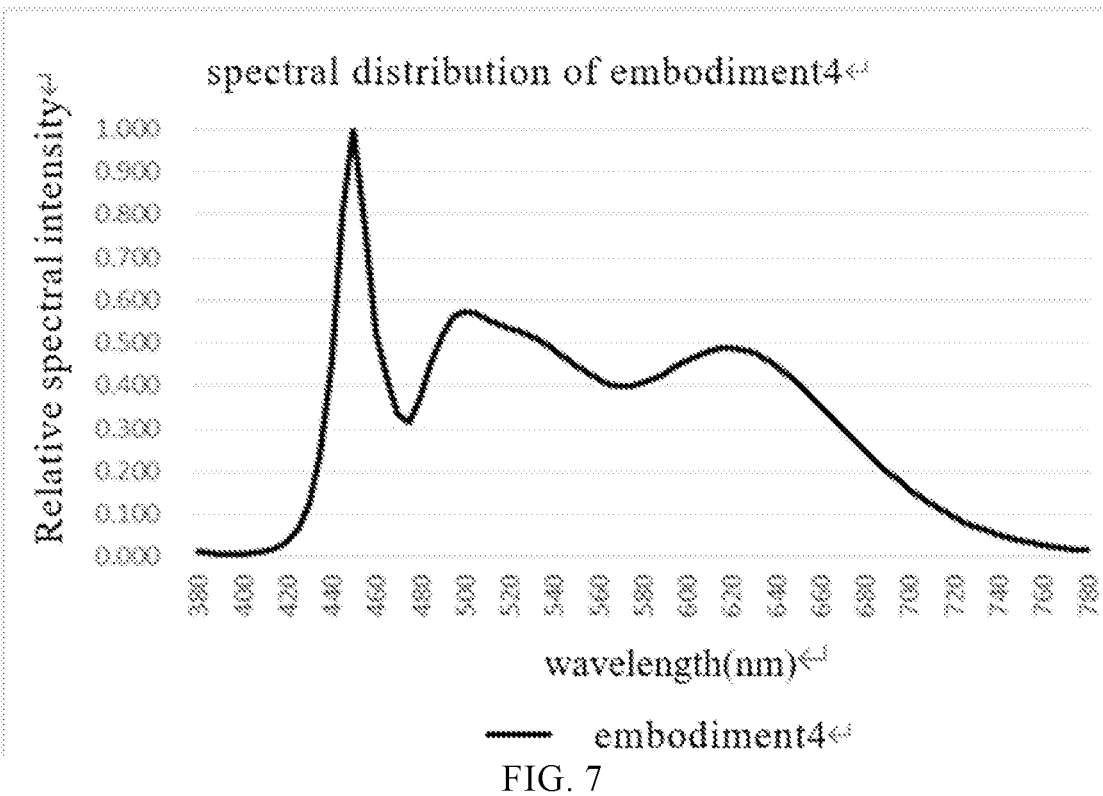
FIG. 7 is a spectrum diagram of emitted light according to example 4 of the present disclosure.

In the example 4, in the light source module L1, the first light-emitting element 1 is a blue LED chip with Peak=450 nm. Weigh 1.22 g of red fluorescent powder with the code R630 as the third additional luminous body 203. The second additional luminous body 202 is composed of 0.80 g of green fluorescent powder with the code G-L535 and 1.15 g of green fluorescent powder with the code G-Ga535. Weigh 1.32 g of blue-green fluorescent powder with the code BG490 as the first additional luminous body 201. Put the above fluorescent powder into transparent silica gel, mix it fully and evenly in a mixer, coat it on the blue LED chip, dry and remove bubbles to obtain a cold white LED chip, its spectrum is shown in FIG. 7, and the specific luminous characteristics are shown in Table 3.

Figure 8:
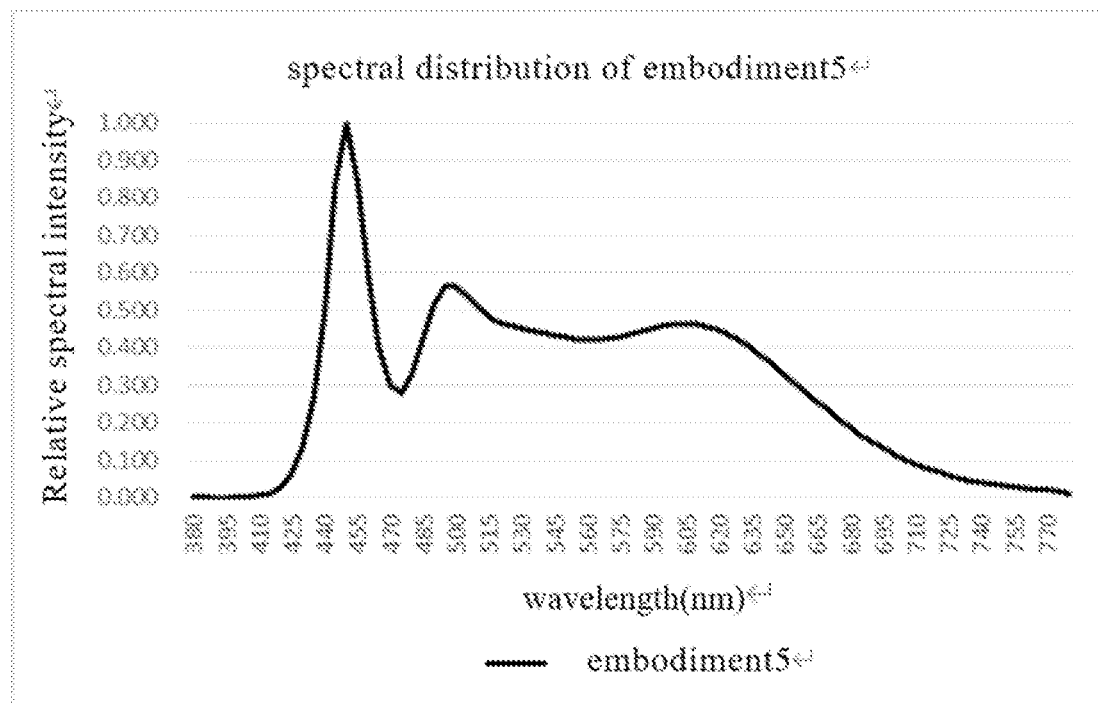
FIG. 8 is a spectrum diagram of emitted light according to example 5 of the present disclosure.

In the example 5, in the light source module L1, the first light-emitting element 1 is a blue LED chip with Peak=450 nm. Weigh 1.06 g of red fluorescent powder with the code R630 as the third additional luminous body 203. The second additional luminous body 202 is composed of yellow fluorescent powder with the code Y550 and green fluorescent powder with the code G-L535, where the yellow fluorescent powder is 0.80 g and the green fluorescent powder G-L535 is 0.95 g. Weigh 1.23 g of blue-green fluorescent powder with the code BG490 as the first additional luminous body 201. Put the above fluorescent powder into transparent silica gel, mix it fully and evenly in a mixer, coat it on the blue LED chip, dry and remove bubbles to obtain a cold white LED chip, its spectrum is shown in FIG. 8, and the specific luminous characteristics are shown in Table 3.

Figure 9:
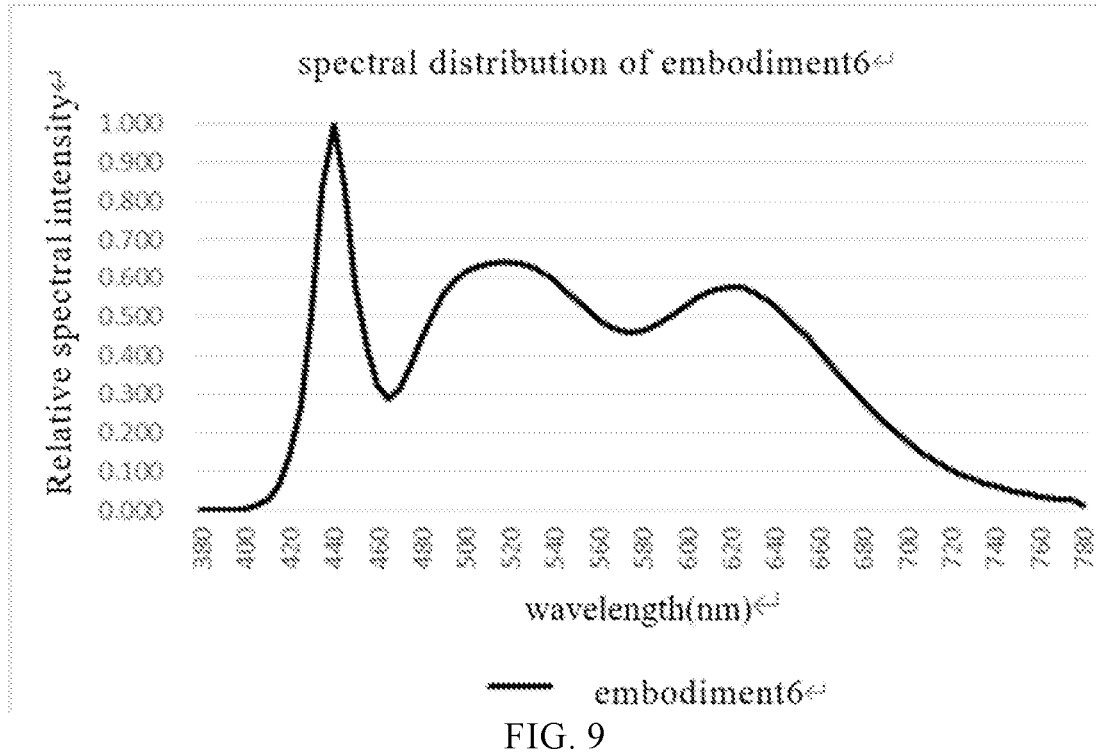
FIG. 9 is a spectrum diagram of emitted light according to example 6 of the present disclosure.

In the example 6, in the light source module L1, the first light-emitting element 1 is a blue LED chip with Peak=440 nm. Weigh 1.32 g of red fluorescent powder with the code R630 as the third additional luminous body 203. The second additional luminous body 202 is composed of yellow fluorescent powder with the code Y565 and green fluorescent powder with the code G-Ga535, where the yellow fluorescent powder is 0.80 g and the green fluorescent powder is 1.45 g. Weigh 1.26 g of blue-green fluorescent powder with the code BG500 as the first additional luminous body 201. Put the above fluorescent powder into transparent silica gel, mix it fully and evenly in a mixer, coat it on the blue LED chip, dry and remove bubbles to obtain a cold white LED chip, its spectrum is shown in FIG. 9, and the specific luminous characteristics are shown in Table 3.

Figure 10:
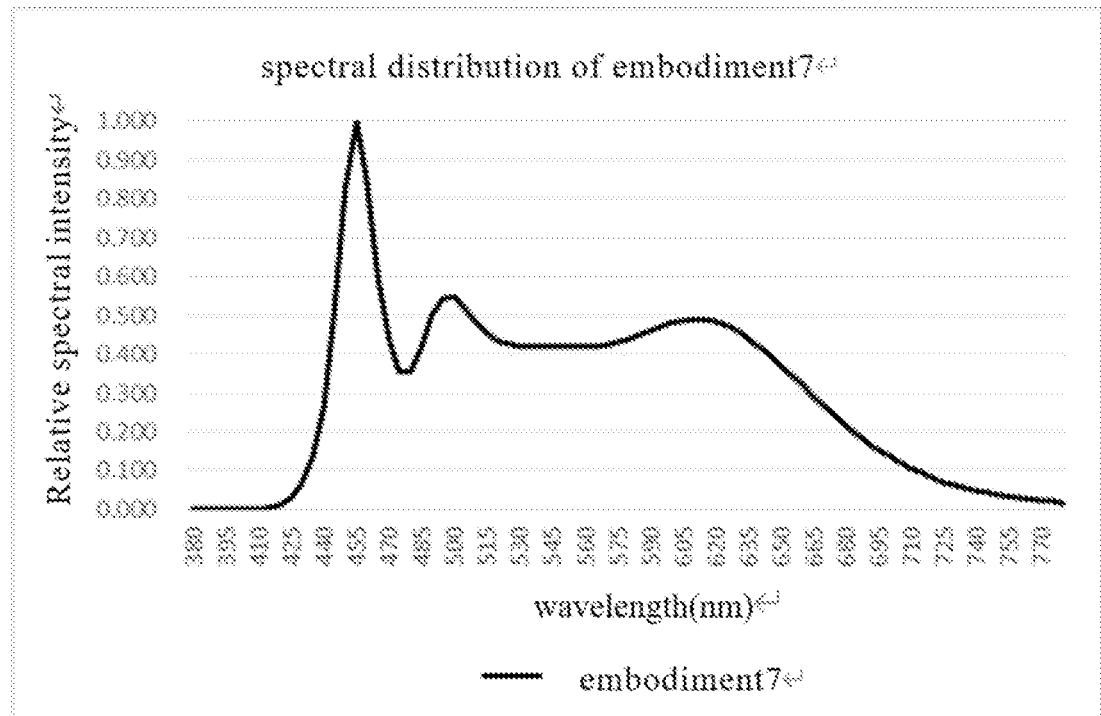
FIG. 10 is a spectrum diagram of emitted light according to example 7 of the present disclosure.

In the example 7, in the light source module L1, the first light-emitting element 1 is a blue LED chip with Peak=455 nm. Weigh 1.55 g of red fluorescent powder with the code R630 as the third additional luminous body 203. The second additional luminous body 202 is composed of yellow fluorescent powder with the code Y565 and green fluorescent powder with the code G-Ga535, where the yellow fluorescent powder is 1.00 g and the green fluorescent powder is 1.26 g. Weigh 1.47 g of blue-green fluorescent powder with the code BG490 as the first additional luminous body 201. Put the above fluorescent powder into transparent silica gel, mix it fully and evenly in a mixer, coat it on the blue LED chip, dry and remove bubbles to obtain a positive white LED chip, its spectrum is shown in FIG. 10, and the specific luminous characteristics are shown in Table 3.

Figure 11:
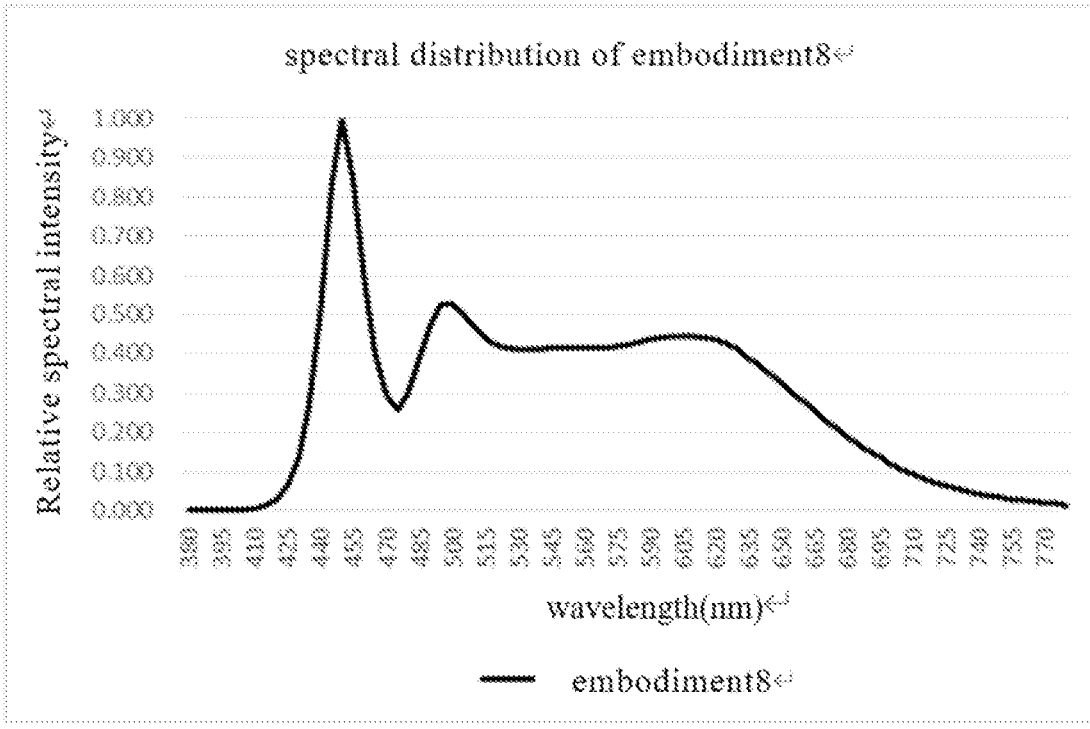
FIG. 11 is a spectrum diagram of emitted light according to example 8 of the present disclosure.

In the example 8, in the light source module L1, the first light-emitting element 1 is a blue LED chip with Peak=450 nm. Weigh 1.13 g of red fluorescent powder with the code R630 as the third additional luminous body 203. The second additional luminous body 202 is composed of yellow fluorescent powder with the code Y565 and green fluorescent powder with the code G-Ga535, where the yellow fluorescent powder is 0.80 g and the green fluorescent powder is 1.08 g. Weigh 1.40 g of blue-green phosphor with the code BG490 as the first additional luminous body 201. Put the above fluorescent powder into transparent silica gel, mix it fully and evenly in a mixer, coat it on the blue LED chip, dry and remove bubbles to obtain a day white LED chip, its spectrum is shown in FIG. 11, and the specific luminous characteristics are shown in Table 3.

TABLE 3

|  | x | y | CCT | duv | CRI | CS_500lux |
|---|---|---|---|---|---|---|
| Example 1 | 0.3281 | 0.3373 | 5699 | 0.000 | 91.72 | 0.471 |
| Example 2 | 0.3304 | 0.3371 | 5591 | −0.001 | 95.65 | 0.464 |
| Example 3 | 0.3305 | 0.3501 | 5585 | 0.005 | 96.02 | 0.451 |
| Example 4 | 0.3245 | 0.3384 | 5864 | 0.002 | 93.93 | 0.469 |
| Example 5 | 0.3217 | 0.3295 | 6027 | −0.001 | 95.85 | 0.479 |
| Example 6 | 0.3290 | 0.3436 | 5652 | 0.003 | 93.11 | 0.453 |
| Example 7 | 0.3304 | 0.3317 | 5591 | −0.004 | 91.03 | 0.476 |
| Example 8 | 0.3222 | 0.3233 | 6026 | −0.005 | 95.51 | 0.484 |

Table 3 lists the luminous characteristics of the light source modules L1 in examples 1-8, where x, y represent the coordinate values of the light color of the emitted light of the light source module L1 on the x and y axes on the CIE1931 color coordinate system, CCT is the color temperature, duv represents the distance and direction of the color offset Planck trajectory in the color coordinate system, and CRI is the color rendering index. The CS value 500 lux in the present application represents the CS value of the emitted light of the light source module L1 at the illuminance of 500 lux. The specific calculation formula is as follows:

$$CS = 0.7 - \frac{0.7}{1 + \left(\frac{CL_A}{355.7}\right)^{1.1026}}$$

where, $$CL_A = 1548 \times \left\{ \int Mc(\lambda)P(\lambda)d\lambda + \right.$$

$$0.7 \times \left( \int \frac{s(\lambda)}{mp(\lambda)} P(\lambda)d\lambda - 0.2616 \times \int \frac{v(\lambda)}{mp(\lambda)} P(\lambda)d\lambda \right) -$$

$$\left. 3.3 \times \left( 1 - e^{\left(\frac{\int V'(\lambda)*P(\lambda)*d\lambda'}{-6.5}\right)} \right) \right\},$$

if $\left( \int \frac{s(\lambda)}{mp(\lambda)} P(\lambda)d\lambda - 0.2616 \times \int \frac{v(\lambda)}{mp(\lambda)} P(\lambda)d\lambda \right) > 0;$ $$CL_A = 1548 \times \left\{ \int Mc(\lambda)P(\lambda)d\lambda \right\},$$

if $\left( \int \frac{s(\lambda)}{mp(\lambda)} P(\lambda)d\lambda - 0.2616 \times \int \frac{V(\lambda)}{mp(\lambda)} P(\lambda)d\lambda \right) \leq 0,$ where $P(\lambda) = \frac{500 \times P_0(\lambda)}{683 \times \sum V(\lambda) P_0(\lambda) d\lambda},$ $P_0(\lambda)$:

the spectral distribution of light source; $P(\lambda)$: the spectral distribution corresponding to the light source of 500 lux; $Mc(\lambda)$: melanopsin sensitivity curve corrected by lens transmittance; $S(\lambda)$: S-type cone cell sensitivity curve; $mp(\lambda)$: macular pigment transmittance; $V(\lambda)$: luminous efficiency function; $V'(\lambda)$: dark visual efficiency function; the calculation formula is based on the mathematical model of human rhythm light conduction published by LRC.

Figure 3:
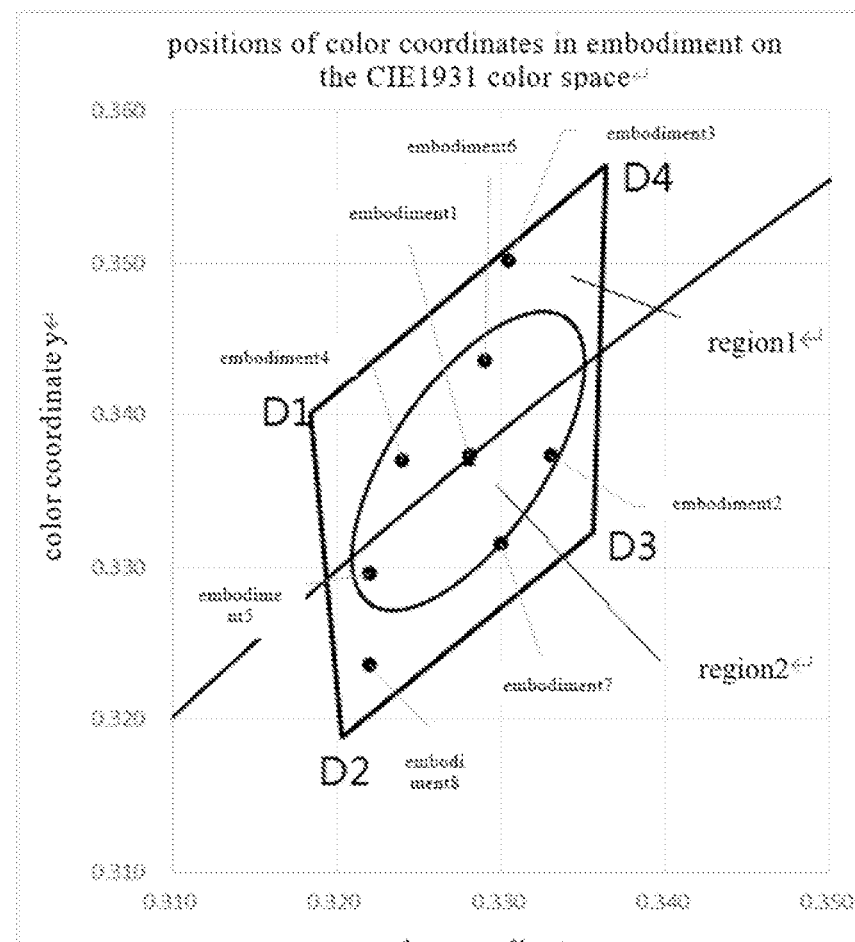
FIG. 3 is a CIE1931 color coordinate diagram according to example 1 to example 8 of the present disclosure.

From table 3, we can see that the CS values of the emitted light of the light source modules L1 of all the examples at the illuminance of 500 lux are greater than 0.45, and the color rendering indexes conform to CRI≥90.0. We mark the luminous light color in each example on the CIE1931 color coordinate system. As shown in FIG. 3, the light color of each example falls near the black body trajectory with the relevant color temperature of 5750±400K, and the distance from the black body trajectory BBL is less than 0.006, that is, duv is in this range of −0.006~0.006, and all points fall in the quadrilateral region enclosed by four vertices D1 (0.3184,0.3401), D2 (0.3203,0.3189), D3 (0.3356,0.3323) and D4 (0.3364,0.3564), that is, the region 1 in the figure. After conducting user experiments on these examples in the later stage, it is found that the effects of the examples 1, 2, 4, 5, 6 and 7 are better, and from FIG. 3, it can be found that these points all fall into the region 2 shown in figure, and the region 2 is an ellipse with the central point x0=0.3281, y0=0.3372, the long axis a=0.00223, the short axis b=0.00095, the inclination angle θ=58.2°, and SDCM=5.0.

Figure 2:
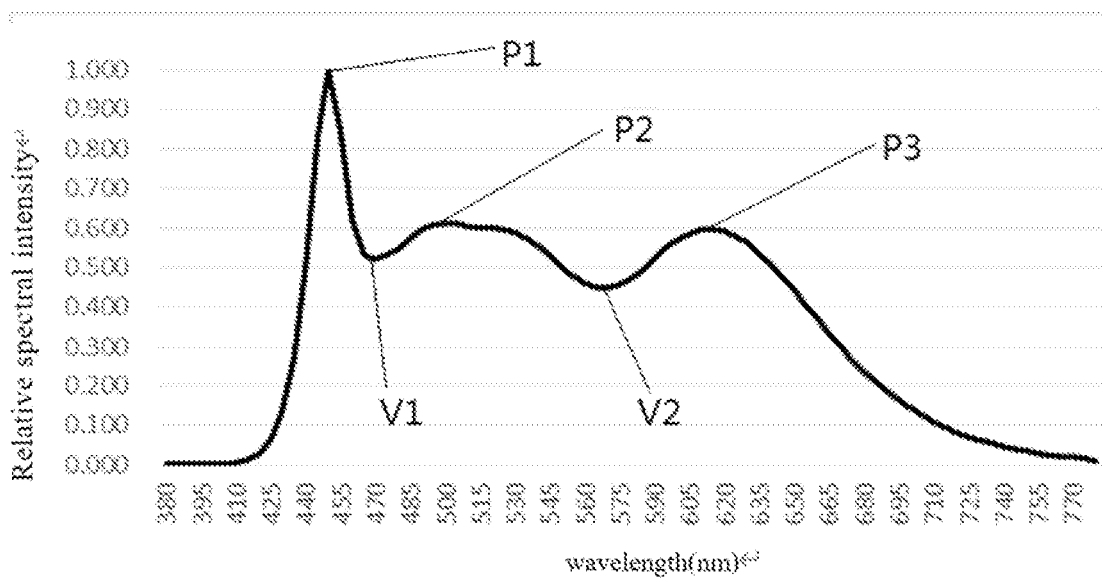
FIG. 2 is a schematic diagram of spectral features of a light source module according to an example of the present disclosure.

The reason why the examples provided by us can achieve high CS value is mainly due to the energy distribution of the emitted light at different wavelengths. These characteristics are more specifically embodied in the waveform features of the spectrum in addition to the different energy distribution in the different wavelength regions defined earlier. FIG. 2 is a schematic spectrum diagram that best reflects the spectral characteristics of the emitted light of the light source module L1 of the present application. We will explain the spectral characteristics of the present application according to FIG. 2. As can be seen from FIG. 2, the spectrum of the emitted light comprises a first peak P1, a first peak valley V1, a second peak P2, a second peak valley V2 and a third peak P3 distributed in turn.

The first peak P1 is located in the wavelength region of 435~465 nm. Since the light source module L1 uses the blue LED chip of the first light-emitting element 1 as the excitation light source, although a large part of the light emitted by the blue LED chip has been wavelength-converted by additional luminous bodies, there is still a part of the energy that has not been converted. These energies form the first peak in the wavelength region of 435~465 nm. The P1 point may be the same as the peak wavelength of the blue LED chip, because the main source of the energy of this peak is the first light-emitting element 1, but the light converted by each additional luminous body may also have part of energy in this wavelength band. After the two are mixed, this first peak P1 does not necessarily coincide with the position of the peak wavelength of the blue LED chip of the original first light-emitting element 1, and may drift slightly, but it is still in the wavelength region of 435~465 nm. The first peak P1 is basically located in the range of [380~470 nm], so the energy of the wavelength in the [380~470 nm] range is mainly the energy of the first peak P1.

The second peak P2 is located in the wavelength region of 485~525 nm. The energy of the second peak P2 is provided by blue-green light, the blue-green fluorescent powder of the first light-emitting element 1 receives part of the light emitted by the blue LED chip of the first light-emitting element 1 and converts it into the blue-green light. The ratio of the spectral intensity of the second peak P2 to the spectral intensity of the first peak P1 is in the range of 45%~85%, and optionally 55~75%.

The third peak P3 is located in the wavelength region of 595~645 nm. The energy of the third peak P3 is provided by red light, the red fluorescent powder or orange fluorescent powder of the third additional luminous body 203 receives part of the light emitted by the blue LED chip of the first light-emitting element 1 converts it into the red light. The ratio of the spectral intensity of the third peak P3 to the spectral intensity of the first peak P1 is in the range of 40%~70%, and optionally 42~60%. The spectral energy of emitted light in the wavelength range of (560~780 nm] is mainly provided by the third peak P3.

The first peak valley V1 is the lowest point in the spectrum between the first peak P1 and the second peak P2, and the energies at the bottom of the two peaks are superimposed here. Therefore, the ratio of the spectral intensity of the first peak valley V1 to the spectral intensity of the first peak P1 may be greater than or equal to 25.0%.

The second peak valley V2 is the lowest point in the spectrum between the second peak P2 and the third peak P3. Due to the long distance between the second peak P2 and the third peak P3, only relying on the energy of the second peak P2, it is cannot ensure that the spectral energy of the emitted light in the wavelength range (470~560 nm) remains 25.0%~45.0% of the entire spectral energy. Therefore, the second additional luminous body 202 is added in the present application, the second additional luminous body 202 receives part of the light emitted by the blue LED chip of the first light-emitting element 1 and converting it into the yellow and green light, and the energy provided by the yellow and green light is distributed in the region of (470~520 nm]. This energy distribution also raises the second peak valley V2, so that the ratio of the spectral intensity of the second peak valley V2 to the spectral intensity of the first peak P1 is in the range of 30.0%~60.0%, and optionally 35.0%~50.0%. Here we explain again that, generally, selecting yellow or green fluorescent powder for the second additional luminous body can also ensure the energy ratio of this position, however, the spectrum fluctuates greatly, and another peak may be formed between the second peak P2 and the third peak P3. Of course, the appearance of the new peak does not affect the CS value of the entire spectrum, and the second peak valley V2 is still the lowest point in the spectrum located between the second peak P2 and the third peak P3. However, from the perspective of color rendering, we still hope that the energy distribution in this range is more uniform. Therefore, in the optional examples 3, 5, 6, 7 and 8, the second additional luminous body 202 adopts a mixture of two kinds of fluorescent powder with different peak wavelengths, and optionally, the two kinds of fluorescent powder select fluorescent powder of different colors, that is, one is yellow fluorescent powder and the other is green fluorescent powder. After the two kinds of fluorescent powder are mixed, part of the emitted light of the first light-emitting element 1 is converted to provide the main energy in the wavelength range of (470~520 nm]. The energy in the wavelength range of (470~570 nm] is jointly provided by the first additional luminous body 201 and the second additional luminous body 202.

The positions of the above peaks can basically ensure the energy ratio in each range, but further limiting the peak energy ratio between the second peak P2 and the third peak P3 can obtain better luminous effect, further ensure the acquisition of high CS values, and ensure high luminous efficiency and high color rendering. In an example, the ratio of the spectral intensity of the third peak P3 to the spectral intensity of the second peak P2 is in the range of 75%~105%, and optionally 80%~100%.

In FIG. 2, we can see that the spectrum of the emitted light is continuously distributed. The so-called continuous distribution means that the spectral curve is relatively flat and there is no large energy fluctuation between adjacent two points. As shown in the spectrum diagrams of FIG. 4-FIG. 11 of various examples, there is no point with spectral energy of 0 between several peaks, such a spectral curve can ensure that there is a certain energy distribution at every point in the range of 380~780 nm, so that the spectrum has better color rendering.

Table 4 lists the feature values of each spectrum of examples 1-8. P1, P2, P3, V1 and V2 in the table refer to the wavelength of the first peak P1, the second peak P2, the third peak P3, the first peak valley V1 and the second peak valley V2, respectively, the unit is nm. I_P2/I_P1 refers to the ratio of the spectral intensity of the second peak P2 to the spectral intensity of the first peak P1, I_P3/I_P1 refers to the ratio of the spectral intensity of the third peak P3 to the spectral intensity of the first peak P1, I_V1/I_P1 refers to the ratio of the spectral intensity of the first peak valley V1 to the spectral intensity of the first peak P1, I_V2/I_P1 refers to the ratio of the spectral intensity of the second peak valley V2 to the spectral intensity of the first peak P1, I_P3/I_P2 refers to the ratio of the spectral intensity of the third peak P3 to the spectral intensity of the second peak P2.

|  | P1 (nm) | P2 (nm) | P3 (nm) | V1 (nm) | V2 (nm) | I_P2/ I_P1 | I_P3/ I_P1 | I_V1/ I_P1 | I_V2/ I_P1 | I_P3/ I_P2 |
| --- | --- | --- | --- | --- | --- | --- | --- | --- | --- | --- |
| Example 1 | 450.0 | 500.0 | 615.0 | 465.0 | 570.0 | 61.2% | 59.8% | 52.2% | 44.9% | 97.7% |
| Example 2 | 450.0 | 500.0 | 615.0 | 475.0 | 560.0 | 59.3% | 51.6% | 28.2% | 45.4% | 86.9% |
| Example 3 | 450.0 | 500.0 | 620.0 | 475.0 | 575.0 | 62.5% | 53.8% | 32.9% | 44.7% | 86.1% |
| Example 4 | 450.0 | 500.0 | 620.0 | 475.0 | 570.0 | 57.4% | 48.8% | 31.5% | 39.9% | 85.1% |
| Example 5 | 450.0 | 500.0 | 600.0 | 475.0 | 560.0 | 56.6% | 46.3% | 27.8% | 42.3% | 81.7% |
| Example 6 | 440.0 | 515.0 | 625.0 | 465.0 | 575.0 | 64.0% | 57.7% | 28.8% | 45.8% | 90.2% |
| Example 7 | 455.0 | 500.0 | 610.0 | 480.0 | 540.0 | 54.6% | 49.0% | 35.4% | 41.9% | 89.8% |
| Example 8 | 450.0 | 500.0 | 605.0 | 475.0 | 630.0 | 52.7% | 44.5% | 25.9% | 41.0% | 84.4% |

These feature values all fall in the range of the spectral features described above. Because of the existence of these features, the examples 1-8 with these spectral features can achieve the energy ratio in the defined ranges. Table 5 lists the energy ratio in the specified range in each spectrum of examples 1-8. I_Σ[380-470] nm, I_Σ(470-520] nm, I_Σ [470-560] nm, I_Σ(560-780] nm respectively represent the ratio of spectral energy of the listed wavelength range in the entire spectral energy.

TABLE 5

| | I_Σ [380-470] nm | I_Σ (470-520] nm | I_Σ [470-560] nm | I_Σ (560-780] nm |
|---|---|---|---|---|
| Example 1 | 18.9% | 20.7% | 35.8% | 45.3% |
| Example 2 | 19.7% | 19.3% | 34.1% | 46.2% |
| Example 3 | 17.7% | 19.8% | 35.3% | 47.0% |
| Example 4 | 19.2% | 19.8% | 34.8% | 46.0% |
| Example 5 | 21.1% | 19.8% | 34.6% | 44.3% |
| Example 6 | 19.2% | 19.2% | 34.9% | 45.9% |
| Example 7 | 19.7% | 19.2% | 33.2% | 47.1% |
| Example 8 | 21.8% | 18.8% | 33.2% | 44.9% |

The energy ratio of each range in Table 5 can ensure that the examples 1-8 achieve the luminous characteristics of high CS values.

The purpose of the present disclosure is to solve the above problems and find a cold white LED (5700K) light source with high CS values, high color rendering and high luminous efficiency.

In order to realize the above functions, the technical scheme adopted by the present disclosure is to provide a light source module, which comprises a first light-emitting element and a packaging part covering the first light-emitting element. The first light-emitting element emits first color light with a peak wavelength of 435~465 nm; the packaging part comprises: a first additional luminous body which is arranged to receive part of the light emitted by the first light-emitting element and convert it into second color light with a peak wavelength of 485~515 nm; the second additional luminous body which is arranged to receive part of the light emitted by the first light-emitting element and convert it into third color light with a peak wavelength of 520~580 nm; the third additional luminous body which is arranged to receive part of the light emitted by the first light-emitting element and convert it into fourth color light with a peak wavelength of 615~655 nm, the first color light, the second color light, the third color light and the fourth color light are mixed to form emitted light of the light source module, and the emitted light is neutral white light, that is, on a CIE1931 color space, the emitted light is located in an interval enclosed by points with relevant color temperature of 5750±400K and distances from the black body trajectory duv=−0.006~0.006. The spectrum of the emitted light has following features: defining a spectrum of the emitted light is in a visible light range, that is, a wavelength range [380~780 nm], as an entire spectral energy of the emitted light; a spectral energy in the wavelength range [380~470 nm] accounts for 12.0%~32.0% of the entire spectral energy; a spectral energy in the wavelength range (470~560 nm] accounts for 25.0%~45.0% of the entire spectral energy; a spectral energy in the wavelength range (560~780 nm] accounts for 36.0%~56.0% of the entire spectral energy; a spectral energy in the wavelength range (470~520 nm] accounts for 14.0%~34.0% of the entire spectral energy.

Further, in the spectrum of the emitted light: the spectral energy in the wavelength range [380~470 nm] accounts for 17.0%~27.0% of the total spectral energy; the spectral energy in the wavelength range (470~560 nm] accounts for 27.0%~37.0% of the total spectral energy; the spectral energy in the wavelength range (560~780 nm] accounts for 40.0%~50.0% of the total spectral energy; and the spectral energy in the wavelength range (470~520 nm] accounts for 18.0%~28.0% of the total spectral energy.

Further, the spectrum of the emitted light is continuously distributed in the visible light range of 380~780 nm, and comprises three peaks and two peak valleys, a first peak is located in a wavelength range of 435~465 nm; the second peak is located in a wavelength range of 485~525 nm, and a ratio of a spectral intensity of the second peak to the spectral intensity of the first peak ranges from 45.0% to 85.0%; a first peak valley is located between the first peak and the second peak, and a ratio of a spectral intensity of the first peak valley to the spectral intensity of the first peak is greater than or equal to 25.0%; a third peak is located in a wavelength range of 595~645 nm, and a ratio of a spectral intensity of the third peak to the spectral intensity of the first peak ranges from 40.0% to 70.0%; and a second peak valley is located between the second peak and the third peak, and a ratio of a spectral intensity of the second peak valley to the spectral intensity of the first peak ranges from 30.0% to 60.0%.

Further, in the spectrum of the emitted light: the ratio of the spectral intensity of the second peak to the spectral intensity of the first peak ranges from 55.0% to 75.0%; the ratio of the spectral intensity of the third peak to the spectral intensity of the first peak ranges from 42.0% to 60.0%; and the ratio of the spectral intensity of the second peak valley to the spectral intensity of the first peak ranges from 35.0% to 50.0%.

Further, in the spectrum of the emitted light: the ratio of the spectral intensity of the third peak to the spectral intensity of the second peak ranges from 75% to 105%.

Further, in the spectrum of the emitted light: the ratio of the spectral intensity of the third peak to the spectral intensity of the second peak ranges from 80% to 100%.

Further, the first light-emitting element is a blue LED emitting light with a peak wavelength of 435~465 nm; the first additional luminous body is blue-green fluorescent powder with a peak wavelength of 485~515 nm and a half width of 25~65 nm; the second additional luminous body is yellow fluorescent powder and/or green fluorescent powder with a peak wavelength of 520~580 nm and a half width of 60~115 nm; the third additional luminous body is red fluorescent powder or orange fluorescent powder with a peak wavelength of 615~655 nm and a half width of 80~120 nm, and defining a total weight of the first additional luminous body, the second additional luminous body and the third additional luminous body to be a total fluorescent powder weight.

Further, a ratio of the first additional luminous body in the total fluorescent powder weight ranges from 20.0 to 55.0%.

Further, a ratio of the second additional luminous body in the total fluorescent powder weight ranges from 22.0% to 52.0%.

Further, a ratio of the third additional luminous body in the total fluorescent powder weight ranges from 7.0% to 36.0%.

Further, the blue-green fluorescent powder is formed by mixing any one or more of following fluorescent powder: (a) nitrogen oxide with $Eu^{2+}$ as an activator, and general chemical composition formula: $(Ba,Ca)_{1-x}Si_2N_2O_2:Eu_x$, where x=0.005~0.200; (b) Ga doped garnet fluorescent powder with $Eu^{2+}$ as an activator, and general chemical composition formula: Ga—LuAG:Eu; (c) silicate fluorescent powder with $Eu^{2+}$ as an activator, and general chemical composition formula: $Ba_2SiO_4$:Eu.

Further, the yellow fluorescent powder/green fluorescent powder is formed by mixing any one or more of following fluorescent powder: (a) garnet structure fluorescent powder with $Ce^{3+}$ as an activator, and general chemical composition formula: $(M1)_{3-x}(M2)_5O_{12}:Ce_x$, where M1 is at least one element selected from a group consisting of Y, Lu, Gd and La, M2 is at least one element selected from a group consisting of Al and Ga, and x=0.005~0.200; (b) silicate system fluorescent powder with $Eu^{2+}$ as an activator, and general chemical composition formula: $(M3)_{2-x}SiO_4:Eu_x$ or $(Ba,Ca,Sr)_{2-x}(Mg,Zn)Si_2O_7:Eu_x$, where M3 is at least one element selected from a group consisting of Mg, Sr, Ca and Ba, and x=0.01~0.20; (c) nitrogen oxide fluorescent powder (Cylon β-SiALON) with $Eu^{2+}$ as an activator, and general chemical composition formula: $Si_bAl_cO_dN_e:Eu_x$, where x=0.005~0.400, b+c=12, and d+e=16; (d) aluminate system fluorescent powder with $Eu^{2+}$ as an activator, and general chemical composition formula: $(Sr,Ba)_{2-x}Al_2O_4:Eu_x$ or $(Sr,Ba)_{4-x}Al_{14}O_{25}:Eu_x$, where x=0.01~0.15.

Further, the red fluorescent powder or the orange fluorescent powder is formed by mixing any one or more of following fluorescent powder: (a) nitride red powder having a 1113 crystal structure with $Eu^{2+}$ as an activator, and general chemical composition formula: $(M4)_{1-x}AlSiN_3:Eu_xr$, where M4 is at least one element selected from a group consisting of Ca, Sr and Ba, x=0.005~0.300; (b) nitride red powder having a 258 crystal structure with $Eu^{2+}$ as an activator, and general chemical composition formula: $(M5)_{2-x}Si_5N_8:Eu_x$, where M5 is at least one element selected from a group consisting of Ca, Sr, Ba and Mg, x=0.005~0.300; (c) nitrogen oxide fluorescent powder (Cylon α-SiALON) with $Eu^{2+}$ as an activator, and general chemical composition formula: $((M6)_{1-a})_xSi_bAl_cO_dN_e:Eu_a$, where M6 is at least one element selected from a group consisting of Li, Na, K, Rb, Cs, Sr, Ba, Sc, Y, La and Gd, x=0.15~1.5, a=0.005~0.300, b+c=12, and d+e=16; (d) silicate fluorescent powder with $Eu^{2+}$ as an activator, and general chemical composition formula: $(Sr,Ba)_{3-x}Si_5O_5:Eu_x$.

Further, the packaging part further comprises a base material and a light diffuser, the base material is silica gel or resin, and the light diffuser is one selected from a group consisting of nano titanium oxide, nano alumina and nano silicon oxide.

Further, on the CIE1931 color space, light color of the emitted light of the light source module is located in a quadrilateral region enclosed by four vertices D1 (0.3184, 0.3401), D2 (0.3203, 0.3189), D3 (0.3356, 0.3323) and D4 (0.3364, 0.3564).

Further, on the CIE1931 color space, the light color of the emitted light of the light source module is located within an elliptical range with a center point x0=0.3281, y0 32 0.3372, a long axis a=0.00223, a short axis b=0.00095, an inclination angle θ=58.2°, and an SDCM=5.0.

Further, in a case that the emitted light of the light source module has an illuminance of 500 lux, a CS value is ≥0.45.

Further, a color rendering index CRI of the emitted light of the light source module is ≥90.0.

The present disclosure further provides a lighting device, which comprises the above light source module.

The light source module provided by the present disclosure provides a cold white LED (5700K) light source with high luminous efficiency, high CS values and high color rendering by controlling the ratio of luminous energy of emitted light in different wavelength ranges. This kind of spectrum with high CS values is conducive to people's concentration for study and work under the same illumination and is especially suitable for office lighting.

The present disclosure may include dedicated hardware implementations such as application specific integrated circuits, programmable logic arrays and other hardware devices. The hardware implementations can be constructed to implement one or more of the methods described herein. Examples that may include the apparatus and systems of various implementations can broadly include a variety of electronic and computing systems. One or more examples described herein may implement functions using two or more specific interconnected hardware modules or devices with related control and data signals that can be communicated between and through the modules, or as portions of an application-specific integrated circuit. Accordingly, the system disclosed may encompass software, firmware, and hardware implementations. The terms "module," "sub-module," "circuit," "sub-circuit," "circuitry," "sub-circuitry," "unit," or "sub-unit" may include memory (shared, dedicated, or group) that stores code or instructions that can be executed by one or more processors. The module refers herein may include one or more circuit with or without stored code or instructions. The module or circuit may include one or more components that are connected.

The above descriptions of the optional examples of the present disclosure is for illustration and description and is not intended to exhaust or limit the present disclosure to the specific forms disclosed. Obviously, many modifications and changes may be made, which may be obvious to those skilled in the art and should be comprised in the scope of the present disclosure.

What is claimed is:

1. A light source module, comprising a first light-emitting element and a packaging part covering the first light-emitting element, wherein:

the first light-emitting element emits first color light with a peak wavelength of 435~465 nm; and the packaging part comprises:

a first additional luminous body which is arranged to receive part of light emitted by the first light-emitting element and convert it into second color light with a peak wavelength of 485~515 nm;

a second additional luminous body which is arranged to receive part of light emitted by the first light-emitting element and convert it into third color light with a peak wavelength of 520~580 nm;

a third additional luminous body which is arranged to receive part of light emitted by the first light-emitting element and convert it into fourth color light with a peak wavelength of 615~655 nm, the first color light, the second color light, the third color light and the fourth color light are mixed to form emitted light of the light source module, the emitted light is neutral white light, that is, on a CIE1931 color space, the emitted light is located in an interval enclosed by points with correlated color temperature of 5750±400K and distances from black body trajectory duv=−0.006~0.006, a spectrum of the emitted light has following features:

defining a spectral energy of the spectrum of the emitted light in a visible light range, that is, a wavelength range [380~780 nm], as an entire spectral energy of the emitted light;

a spectral energy in a wavelength range [380~470 nm] accounts for 12.0% ~32.0% of the entire spectral energy;

a spectral energy in a wavelength range (470~560 nm] accounts for 25.0%~45.0% of the entire spectral energy;

a spectral energy in a wavelength range (560~780 nm] accounts for 36.0%~56.0% of the entire spectral energy; and a spectral energy in a wavelength range (470~520 nm] accounts for 14.0%~34.0% of the entire spectral energy.

2. The light source module according to claim 1, wherein, in the spectrum of the emitted light:
the spectral energy in the wavelength range [380~470 nm] accounts for 17.0%~27.0% of the entire spectral energy;
the spectral energy in the wavelength range (470~560 nm] accounts for 27.0%~37.0% of the entire spectral energy;
the spectral energy in the wavelength range (560~780 nm] accounts for 40.0%~50.0% of the entire spectral energy; and
the spectral energy in the wavelength range (470~520 nm] accounts for 18.0%~28.0% of the entire spectral energy.

3. The light source module according to claim 1, wherein:
the spectrum of the emitted light is continuously distributed in the visible light range of 380~780 nm, and comprises three peaks and two peak valleys,
a first peak is located in a wavelength range of 435~465 nm;
a second peak is located in a wavelength range of 485~525 nm, and a ratio of a spectral intensity of the second peak to a spectral intensity of the first peak ranges from 45.0% to 85.0%;
a first peak valley is located between the first peak and the second peak, and a ratio of a spectral intensity of the first peak valley to the spectral intensity of the first peak is greater than or equal to 25.0%;
a third peak is located in a wavelength range of 595~645 nm, and a ratio of a spectral intensity of the third peak to the spectral intensity of the first peak ranges from 40.0% to 70.0%; and
a second peak valley is located between the second peak and the third peak, and a ratio of a spectral intensity of the second peak valley to the spectral intensity of the first peak ranges from 30.0% to 60.0%.

4. The light source module according to claim 3, wherein, in the spectrum of the emitted light:
the ratio of the spectral intensity of the second peak to the spectral intensity of the first peak ranges from 55.0% to 75.0%;
the ratio of the spectral intensity of the third peak to the spectral intensity of the first peak ranges from 42.0% to 60.0%; and
the ratio of the spectral intensity of the second peak valley to the spectral intensity of the first peak ranges from 35.0% to 50.0%.

5. The light source module according to claim 3, wherein, in the spectrum of the emitted light: the ratio of the spectral intensity of the third peak to the spectral intensity of the second peak ranges from 75% to 105%.

6. The light source module according to claim 5, wherein, in the spectrum of the emitted light: the ratio of the spectral intensity of the third peak to the spectral intensity of the second peak ranges from 80% to 100%.

7. The light source module according to claim 1, wherein the first light-emitting element is a blue LED emitting light with a peak wavelength of 435~465 nm; the first additional luminous body is blue-green fluorescent powder with a peak wavelength of 485~515 nm and a half width of 25~65 nm; the second additional luminous body is yellow fluorescent powder and/or green fluorescent powder with a peak wavelength of 520~580 nm and a half width of 60~115 nm; the third additional luminous body is red fluorescent powder or orange fluorescent powder with a peak wavelength of 615~655 nm and a half width of 80~120 nm, and defining a total weight of the first additional luminous body, the second additional luminous body and the third additional luminous body to be a total fluorescent powder weight.

8. The light source module according to claim 7, wherein a ratio of the first additional luminous body in the total fluorescent powder weight ranges from 20.0 to 55.0%.

9. The light source module according to claim 7, wherein a ratio of the second additional luminous body in the total fluorescent powder weight ranges from 22.0% to 52.0%.

10. The light source module according to claim 7, wherein a ratio of the third additional luminous body in the total fluorescent powder weight ranges from 7.0% to 36.0%.

11. The light source module according to claim 7, wherein the blue-green fluorescent powder is formed by mixing any one or more of following fluorescent powder:
(a) nitrogen oxide with $Eu^{2+}$ as an activator, and general chemical composition formula: $(Ba,Ca)_{-x}Si_2N_2O_2:Eu_x$, where x=0.005~0.200;
(b) Ga doped garnet fluorescent powder with $Eu^{2+}$ as an activator, and general chemical composition formula: Ga—LuAG:Eu;
(c) silicate fluorescent powder with $Eu^{2+}$ as an activator, and general chemical composition formula: $Ba_2SiO_4$:Eu.

12. The light source module according to claim 7, wherein the yellow fluorescent powder/green fluorescent powder is formed by mixing any one or more of following fluorescent powder:
(a) garnet structure fluorescent powder with $Ce^{3+}$ as an activator, and general chemical composition formula: $(M1)_{3-x}(M2)_5O_{12}:Ce_x$,
where M1 is at least one element selected from a group consisting of Y, Lu, Gd and La, M2 is at least one element selected from a group consisting of Al and Ga, and x=0.005~0.200;
(b) silicate system fluorescent powder with $Eu^{2+}$ as an activator, and general chemical composition formula: $(M3)_{2-x}SiO_4:Eu_x$ or $(Ba,Ca,Sr)_{2-x}(Mg,Zn)Si_2O_7:Eu_x$,
where M3 is at least one element selected from a group consisting of Mg, Sr, Ca and Ba, and x=0.01~0.20;
(c) nitrogen oxide fluorescent powder (Cylon β-SiALON) with $Eu^{2+}$ as an activator, and general chemical composition formula: $Si_bAl_cO_dN_e:Eu_x$,
where x=0.005~0.400, b+c=12, and d+e=16;
(d) aluminate system fluorescent powder with $Eu^{2+}$ as an activator, and general chemical composition formula: $(Sr,Ba)_{2-x}Al_2O_4:Eu_x$ or $(Sr,Ba)_{4-x}Al_4O_{25}:Eu_x$,
where x=0.01~0.15.

13. The light source module according to claim 7, wherein the red fluorescent powder or the orange fluorescent powder is formed by mixing any one or more of following fluorescent powder:
(a) nitride red powder having a 1113 crystal structure with $Eu^{2+}$ as an activator, and general chemical composition formula: $(M4)_{1-x}AlSiN_3:Eu_x$,
where M4 is at least one element selected from a group consisting of Ca, Sr and Ba, x=0.005~0.300;
(b) nitride red powder having a 258 crystal structure with $Eu^{2+}$ as an activator, and general chemical composition formula: $(M5)_{2-x}Si_5N_8:Eu_x$,
where M5 is at least one element selected from a group consisting of Ca, Sr, Ba and Mg, x=0.005~0.300;
(c) nitrogen oxide fluorescent powder (Cylon α-SiALON) with $Eu^{2+}$ as an activator, and general chemical composition formula: $((M6)_{1-a})_xSi_bAl_cO_dN_e:Eu_a$,
where M6 is at least one element selected from a group consisting of Li, Na, K, Rb, Cs, Sr, Ba, Sc, Y, La and Gd, x=0.15~1.5, a=0.005~0.300, b+c=12, and d+e=16;

(d) silicate fluorescent powder with $Eu^{2+}$ as an activator, and general chemical composition formula: $(Sr,Ba)_{3-x}Si_5O_5:Eu_x$.

14. The light source module according to claim 7, wherein the packaging part further comprises a base material and a light diffuser, the base material is silica gel or resin, and the light diffuser is one selected from a group consisting of nano titanium oxide, nano alumina and nano silicon oxide.

15. The light source module according to claim 1, wherein, on the CIE1931 color space, light color of the emitted light of the light source module is located in a quadrilateral region enclosed by four vertices D1 (0.3184, 0.3401), D2 (0.3203, 0.3189), D3 (0.3356, 0.3323) and D4 (0.3364, 0.3564).

16. The light source module according to claim 15, wherein, on the CIE1931 color space, the light color of the emitted light of the light source module is located within an elliptical range with a center point x0=0.3281, y0=0.3372, a long axis a=0.00223, a short axis b=0.00095, an inclination angle θ=58.2 °, and an SDCM=5.0.

17. The light source module according to claim 1, wherein, in a case that the emitted light of the light source module has an illuminance of 500 lux, a CS value is ≥0.45.

18. The light source module according to claim 1, wherein a color rendering index CRI of the emitted light of the light source module is ≥90.0.

19. A lighting device comprising a light source module, wherein the light source module comprises a first light-emitting element and a packaging part covering the first light-emitting element, wherein:
the first light-emitting element emits first color light with a peak wavelength of 435~465 nm; and
the packaging part comprises:
a first additional luminous body which is arranged to receive part of light emitted by the first light-emitting element and convert it into second color light with a peak wavelength of 485~515 nm;
a second additional luminous body which is arranged to receive part of light emitted by the first light-emitting element and convert it into third color light with a peak wavelength of 520~580 nm;
a third additional luminous body which is arranged to receive part of light emitted by the first light-emitting element and convert it into fourth color light with a peak wavelength of 615~655 nm,
the first color light, the second color light, the third color light and the fourth color light are mixed to form emitted light of the light source module, the emitted light is neutral white light, that is, on a CIE1931 color space, the emitted light is located in an interval enclosed by points with correlated color temperature of 5750±400K and distances from black body trajectory duv=−0.006~0.006,
a spectrum of the emitted light has following features:
defining a spectral energy of the spectrum of the emitted light in a visible light range, that is, a wavelength range [380~780 nm], as an entire spectral energy of the emitted light;
a spectral energy in a wavelength range [380~470 nm] accounts for 12.0%~32.0% of the entire spectral energy;
a spectral energy in a wavelength range (470~560 nm] accounts for 25.0%~45.0% of the entire spectral energy;
a spectral energy in a wavelength range (560~780 nm] accounts for 36.0%~56.0% of the entire spectral energy; and
a spectral energy in a wavelength range (470~520 nm] accounts for 14.0%~34.0% of the entire spectral energy.

20. The lighting device according to claim 19, wherein, in the spectrum of the emitted light:
the spectral energy in the wavelength range [380~470 nm] accounts for 17.0%~27.0% of the entire spectral energy;
the spectral energy in the wavelength range (470~560 nm] accounts for 27.0%~37.0% of the entire spectral energy;
the spectral energy in the wavelength range (560~780 nm] accounts for 40.0%~50.0% of the entire spectral energy; and
the spectral energy in the wavelength range (470~520 nm] accounts for 18.0%~28.0% of the entire spectral energy.

* * * * *